(12) United States Patent
Lee (10) Patent No.: US 7,889,107 B2
(45) Date of Patent: Feb. 15, 2011

(54) DIGITAL-TO-ANALOG CONVERTER

(75) Inventor: Ju Han Lee, Seongnam (KR)

(73) Assignee: University of Seoul Industry Cooperation Foundation, Seoul (KR)

( * ) Notice: Subject to any disclaimer, the term of this patent is extended or adjusted under 35 U.S.C. 154(b) by 9 days.

(21) Appl. No.: 12/482,997

(22) Filed: Jun. 11, 2009

(65) Prior Publication Data

US 2010/0315273 A1 Dec. 16, 2010

(51) Int. Cl.
*H03M 1/00* (2006.01)
(52) U.S. Cl. .................................. 341/137; 341/144
(58) Field of Classification Search ............... 341/144, 341/137; 359/337; 398/79
See application file for complete search history.

(56) References Cited

U.S. PATENT DOCUMENTS

| 6,160,659 A * | 12/2000 | Kinoshita .................... 359/337 |
| 7,403,711 B2 | 7/2008 | Chen et al. |
| 7,525,461 B1 | 4/2009 | Uhlhorn |
| 2007/0230959 A1 * | 10/2007 | Kamioka et al. ............. 398/79 |

FOREIGN PATENT DOCUMENTS

| WO | 99/34518 A1 | 7/1999 |
| WO | 2004/092776 A2 | 10/2004 |

OTHER PUBLICATIONS

X. Yu, et al "Incoherent photonic digital-to-analogue converter based on broadband optical source" Electronics Letters, vol. 43, No. 19, Sep. 13, 2007.
Araz Yacoubian, et al "Digital-to-Analog Conversion Using Electrooptic Modulators" IEEE Photonics Technology Letters, vol. 15, No. 1, Jan. 2003, pp. 117-119.
International Search Report and Written Opinion, mailed Aug. 25, 2010, as issued in connection with Patent Application No. PCT/KR2010/003769, filed on Jun. 11, 2010.

* cited by examiner

*Primary Examiner*—Jean B Jeanglaude
(74) *Attorney, Agent, or Firm*—Workman Nydegger (57) ABSTRACT

A digital-to-analog converter (DAC) includes multiple electro-optical converters to generate multiple first optical signals in response to multiple input signals, multiple optical attenuators to attenuate intensities of the first optical signals and to generate multiple second optical signals, an optical coupler to combine the second optical signals and to generate a third optical signal, and a photodetector to convert the third optical signal into an electrical analog signal.

20 Claims, 5 Drawing Sheets

DIGITAL-TO-ANALOG CONVERTER

TECHNICAL FIELD

The described technology generally relates to digital-to-analog converters (DACs) and, more particularly, to photonic DACs.

BACKGROUND

In general, data in digital format has a low noise level when being transmitted, stored and processed, and thus is used in various fields of electronics which require stable signal processing. However, the data in digital format needs to be converted into data in analog format when the digital data is applied to analog devices such as radars and displays. Here, a digital-to-analog converter (DAC) may be employed for converting a digital electrical signal into an analog electrical signal. The DAC should have a data conversion rate that is high enough to enable high-speed data transmission, storage and processing. Recently, research on high-speed DACs, including attempts to apply photonics technology to DACs, is being actively conducted.

A photonic DAC (PDAC) has high-speed sampling, a wide bandwidth and reduced interference, and thus is an attractive candidate for next-generation DACs. An example of a PDAC technology is described in the Institute of Electrical and Electronics Engineers (IEEE) Photonics Technology Letters, v. 15, n. 1, p. 117, January 2003, by Araz Yacoubian, et al., which describes a PDAC technique employing a weighted 1×N coupler and a multiple number of electro-optic polymer modulators. Mach-Zehnder modulators (MZMs) are used as the electro-optic polymer modulators. The weighted 1×N coupler divides a continuous wave (CW) laser beam into N beams having various intensities. Another example of a PDAC technology is described in Electronics Letters, v. 43, n. 19, p. 1044, September 2007, by X. Yu, et al., which describes a PDAC technique employing a weighted 1×N coupler and a multiple number of MZMs.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the components of the present disclosure, as generally described herein, and illustrated in the Figures, can be arranged, substituted, combined, and designed in a wide variety of different configurations, all of which are explicitly contemplated herein.

In one embodiment, a DAC includes multiple electro-optical converters to generate multiple first optical signals in response to multiple input signals, multiple optical attenuators to attenuate intensities of the first optical signals and to generate multiple second optical signals, an optical coupler to combine the second optical signals and to generate a third optical signal, and a photodetector to convert the third optical signal into an electrical analog signal.

In another embodiment, a method for converting a digital signal into an analog signal includes generating multiple first optical signals in response to multiple input signals, attenuating intensities of the first optical signals and generating multiple second optical signals, combining the second optical signals and generating a third optical signal, and converting the third optical signal into an electrical analog signal.

Figure 1:
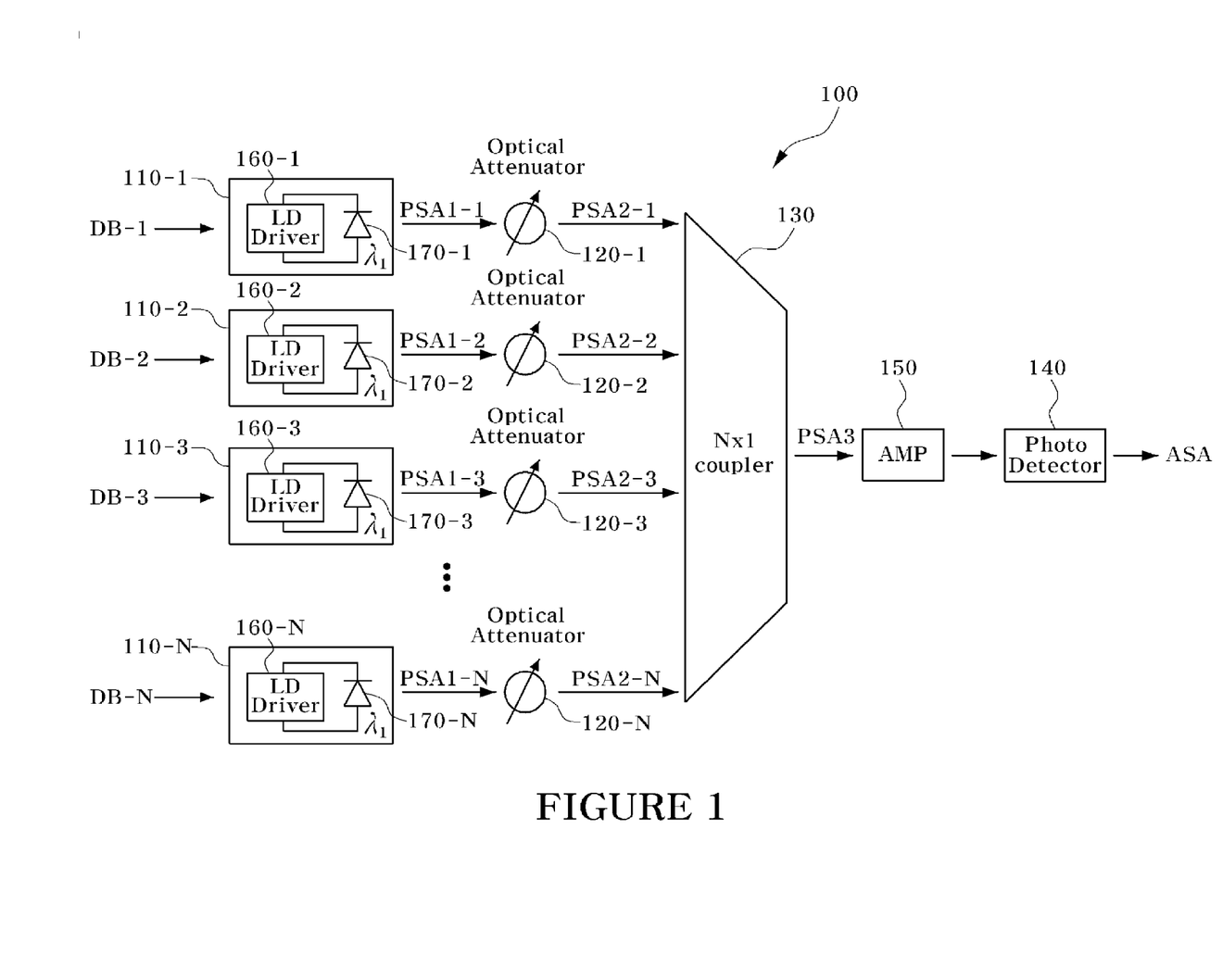
FIG. 1 shows a schematic of an illustrative embodiment of a digital-to-analog converter (DAC)

FIG. 1 shows a schematic of an illustrative embodiment of a digital-to-analog converter (DAC). As illustrated, a DAC 100 includes a multiple number of electro-optical converters 110-1, 110-2, 110-3, . . . , and 110-N that generate a multiple number of first optical signals (N is an integer greater than or equal to 2), a multiple number of optical attenuators 120-1, 120-2, 120-3, . . . , and 120-N that attenuate intensities of the first optical signals to generate a multiple number of second optical signals, an optical coupler 130 that combines the second optical signals to generate a third optical signal, and a photodetector 140 that convert the third optical signal into an electrical analog signal. In some embodiments, the DAC 100 may optionally further include an amplifier 150 which couples the optical coupler 130 with the photodetector 140 to amplify the intensity of the third optical signal.

The electro-optical converters 110-1, 110-2, 110-3, . . . , and 110-N may generate a multiple number of first optical signals PSA1-1, PSA1-2, PSA1-3, . . . , and PSA1-N, respectively, in response to a multiple number of input signals DB-1, DB-2, DB-3, . . . , and DB-N generated, for example, by an external source. The input signals DB-1, DB-2, DB-3, . . . , or DB-N control the working modes of the electro-optical converter 110-1, 110-2, 110-3, . . . , or 110-N, respectively, so that the electro-optical converters 110-1, 110-2, 110-3, . . . , and 110-N may be in an on-state or an off-state. By way of example, when an input signal DB-1 is "1", the corresponding electro-optical converter 110-1 may be in the on-state. When the input signal DB-1 is "0", the corresponding electro-optical converter 110-1 may be in the off-state. Likewise, when some of the input signals DB-2, . . . , and DB-N are "1", the corresponding electro-optical converters 110-2, 110-3, . . . , and 110-N may be in the on-state, and when some of the input signals DB-2, . . . , and DB-N are "0", the corresponding electro-optical converters 110-2, 110-3, . . . , and 110-N may be in the off-state.

When the electro-optical converters 110-1, 110-2, 110-3, . . . , and 110-N are in the on-state, the electro-optical converters 110-1, 110-2, 110-3, . . . , and 110-N may generate the first optical signals PSA1-1, PSA1-2, PSA1-3, . . . , and PSA1-N, respectively. On the other hand, when the electro-optical converters 110-1, 110-2, 110-3, . . . , and 110-N are in the off-state, the electro-optical converters 110-1, 110-2, 110-3, . . . , and 110-N may not generate optical signals or may generate the first optical signals PSA1-1, PSA1-2, PSA1-3, . . . , and PSA1-N having intensities of substantially zero, respectively.

In one embodiment, the first optical signals PSA1-1, PSA1-2, PSA1-3, . . . , and PSA1-N generated in the on-state may have substantially the same intensity as each other. Here, substantially the same intensities of the first optical signals PSA1-1, PSA1-2, PSA1-3, ..., and PSA1-N indicate that intensities of the first optical signals PSA1-1, PSA1-2, PSA1-3, ..., and PSA1-N are exactly the same or within a predetermined permissible error range. Substantially zero intensities of the first optical signals PSA1-1, PSA1-2, PSA1-3, ..., and PSA1-N generated in the off-state indicate that the intensities of the first optical signals PSA1-1, PSA1-2, PSA1-3, ..., and PSA1-N are exactly zero or within a predetermined permissible error range from zero. The predetermined permissible error may change according to requirements for an application field employing the first optical signals PSA1-1, PSA1-2, PSA1-3, ..., and PSA1-N. By way of example, a permissible error of an electro-optical converter receiving a most significant bit (MSB) may be less than a permissible error of an electro-optical converter receiving a least significant bit (LSB).

In another embodiment, the first optical signals PSA1-1, PSA1-2, PSA1-3, and PSA1-N generated in the on-state may have substantially the same wavelengths as each other. Here, substantially the same wavelengths of the first optical signals PSA1-1, PSA1-2, PSA1-3, ..., and PSA1-N indicate that wavelengths of the first optical signals PSA1-1, PSA1-2, PSA1-3, ..., and PSA1-N are exactly the same or within a predetermined permissible error range. The permissible error may change, for example, according to requirements for an application field employing the first optical signals PSA1-1, PSA1-2, PSA1-3, ..., and PSA1-N, or according to the type of the optical coupler 130.

The electro-optical converter 110-1, 110-2, 110-3, ..., or 110-N may have a driver 160-1, 160-2, 160-3, ..., or 160-N and a laser diode 170-1, 170-2, 170-3, ..., or 170-N, respectively. The driver 160-1, 160-2, 160-3, ..., or 160-N may apply a drive signal to its corresponding laser diode 170-1, 170-2, 170-3, ..., or 170-N. The drive signal may correspond to the input signal DB-1, DB-2, DB-3, ..., or DB-N. By way of example, the drive signal may have a type of voltage or current.

In one embodiment, the driver 160-1 may apply a predetermined voltage (e.g., 5 V) that is higher than a threshold voltage to the laser diode 170-1 when the input signal DB-1 is "1". The driver 160-1 may apply a predetermined voltage (e.g., 0 V) that is lower than the threshold voltage to the laser diode 170-1 when the input signal DB-1 is "0". The threshold voltage denotes a minimum voltage applied into the laser diode 170-1, 170-2, 170-3, ..., or 170-N from, for example, an external source in order to drive the laser diode 170-1, 170-2, 170-3, ..., or 170-N. Likewise, when some of the input signals DB-2, DB-3, ..., and DB-N are "1", the corresponding drivers 160-2, 160-3, ..., and 160-N may apply the predetermined voltage (e.g., 5 V) that is higher than the threshold voltage to the corresponding laser diodes 170-2, 170-3, ..., and 170-N. Also, when some of the input signals DB-2, DB-3, ..., and DB-N are "0", the corresponding drivers 160-2, 160-3, ..., and 160-N may apply the predetermined voltage (e.g., 0 V) that is lower than the threshold voltage to the corresponding laser diodes 170-2, 170-3, ..., and 170-N.

In another embodiment, the driver 160-1 may apply a predetermined current corresponding to the on-state to the laser diode 170-1 when the input signal DB-1 is "1". The driver 160-1 may apply a current of substantially zero to the laser diode 170-1 when the input signal DB-1 is "0". Likewise, when some of the input signals DB-2, DB-3, ..., and DB-N are "1", the corresponding drivers 160-2, 160-3, ..., and 160-N may apply the predetermined current corresponding to the on-state to the corresponding laser diodes 170-2, 170-3, ..., and 170-N. Also, when some of the input signals DB-2, DB-3, ..., and DB-N are "0", the corresponding drivers 160-2, 160-3, ..., and 160-N may apply the current of substantially zero to the corresponding laser diodes 170-2, 170-3, ..., and 170-N.

In some embodiments, the driver 160-1, 160-2, 160-3, ..., or 160-N may have a regulator (not shown) to apply the diver signal accurately to the laser diode 170-1, 170-2, 170-3, ..., or 170-N. In other embodiments, when a voltage level of the input signal DB-1, DB-2, DB-3, ..., or DB-N is suited for directly driving the laser diode 170-1, 170-2, 170-3, ..., or 170-N, the electro-optical converter 110-1, 110-2, 110-3, ..., or 110-N may not have the corresponding driver 160-1, 160-2, 160-3, ..., or 160-N.

The laser diodes 170-1, 170-2, 170-3, ..., and 170-N may be, for example, commercially available laser diodes such as semiconductor laser diodes. The semiconductor laser diodes may be monolithic semiconductor laser diodes integrated on a single semiconductor substrate. Since the monolithic semiconductor laser diodes can be fabricated using a batch process, the monolithic semiconductor laser diodes may generate optical signals having substantially the same wavelengths and intensities as each other. The monolithic semiconductor laser diodes can be mass-produced at low cost using a semiconductor process. Instead of the laser diode 170-1, 170-2, 170-3, ..., or 170-N, a light-emitting device such as a light-emitting diode (LED) or organic light-emitting diode (OLED) may be used.

The optical attenuators 120-1, 120-2, 120-3, ..., and 120-N may attenuate intensities of the first optical signals PSA1-1, PSA1-2, PSA1-3, ..., and PSA1-N, and generate a multiple number of second optical signals PSA2-1, PSA2-2, PSA2-3, ..., and PSA2-N. The optical attenuator 120-1, 120-2, 120-3, ..., or 120-N may differentially attenuate the first optical signal PSA1-1, PSA1-2, PSA1-3, ..., or PSA1-N from each other. The attenuation of the optical attenuator 120-1, 120-2, 120-3, ..., or 120-N may be expressed by a difference between the intensity of the second optical signal PSA2-1, PSA2-2, PSA2-3, ..., or PSA2-N and the intensity of the corresponding first optical signal PSA1-1, PSA1-2, PSA1-3, ..., or PSA1-N. As used herein, the intensity difference refers to the optical attenuation of an optical attenuator.

The optical attenuation of the optical attenuator 120-1, 120-2, 120-3, ..., or 120-N may be affected by the input signal DB-1, DB-2, DB-3, ..., or DB-N. The optical attenuation of the optical attenuator 120-1, 120-2, 120-3, ..., or 120-N may be determined based on, for example, a weight of the corresponding input signal DB-1, DB-2, DB-3, ..., or DB-N. In some embodiments, the optical attenuators 120-1, 120-2, 120-3, ..., and 120-N may correspond to the input signals DB-1, DB-2, DB-3, ..., and DB-N, respectively. By way of example, the input signal DB-1 may correspond to a least significant bit (LSB) of a digital signal, and the input signal DB-N may correspond to a most significant bit (MSB) of the digital signal. In this case, the optical attenuator 120-N, 120-(N-1), 120-(N-2), ..., or 120-1 may have the optical attenuation M−3(N−1) dB, M−3(N−2) dB, ..., or M dB, respectively. Here, M is a predetermined value greater than 3(N−1), and dB (decibel) is a logarithmic unit used to denote the intensity of an optical signal. By way of example, when an optical signal has an intensity that is 3 dB greater than another optical signal, the intensity of the optical signal is approximately double the intensity of the other optical signal. The optical attenuation may sequentially decrease by 3 dB from M dB of the optical attenuator 120-1 to M−3(N−1) of the optical attenuator 120-N. Accordingly, the optical attenuators 120-1, 120-2, 120-3, ..., and 120-N may generate attenuation patterns where the intensities of the optical attenuation sequentially decrease by about 2 times (a factor of 2) from the optical attenuator 120-1 to the optical attenuator 120-N.

By way of example, a 4-bit digital signal including the input signals DB-1, DB-2, DB-3 and DB-4 having a bit pattern "1001" may be provided to the optical attenuators 120-1, 120-2, 120-3 and 120-4. In this case, the input signals DB-1, DB-2, DB-3 and DB-4 may be "1", "0", "0" and "1", respectively. When M is 10, the optical attenuators 120-1, 120-2, 120-3 and 120-4 may have optical attenuations of 10 dB, 7 dB, 4 dB and 1 dB, respectively. Accordingly, when receiving the input signals DB-1 and DB-4 having a bit "1", the optical attenuators 120-1 and 120-4 having the optical attenuations of 10 dB and 1 dB, respectively, may attenuate the first optical signals PSA1-1 and PSA1-4 into the second optical signals PSA2-1 and PSA2-4, respectively. That is, when intensities of the first optical signals PSA1-1 and PSA1-4 are the same as $I_0$, the optical attenuators 120-1 and 120-4 may generate the second optical signal PSA2-1 having an intensity of $0.1 \times I_0$ that is attenuated by 10 dB from $I_0$, and the second optical signal PSA2-4 having an intensity of about $0.794 \times I_0$ that is attenuated by 1 dB from $I_0$.

By way of another example, a 4-bit digital signal including the input signals DB-1, DB-2, DB-3 and DB-4 having a bit pattern "1100" may be provided to the optical attenuators 120-1, 120-2, 120-3 and 120-4. In this case, the input signals DB-1, DB-2, DB-3 and DB-4 may be "0", "0", "1" and "1", respectively. When M is 10, the optical attenuators 120-1, 120-2, 120-3 and 120-4 may have optical attenuations of 10 dB, 7 dB, 4 dB and 1 dB, respectively. Accordingly, when receiving the input signals DB-3 and DB-4 having a bit "1", the optical attenuators 120-3 and 120-4 having the optical attenuations of 4 db and 1 db, respectively, may attenuate the first optical signals PAS1-3 and PSA1-4 into the second optical signals PSA2-3 and PSA2-4, respectively. That is when intensities of the first optical signals PSA1-3 and PSA1-4 are the same as $I_0$, the optical attenuators 120-3 and 120-4 may generate the second optical signal PSA2-3 having an intensity of about $0.4 \times I_0$ attenuated by 4 dB from $I_0$, and the second optical signal PSA2-4 having an intensity of about $0.794 \times I_0$ attenuated by 1 dB from $I_0$.

The optical attenuators 120-1, 120-2, 120-3, . . . , and 120-N may be known, commercially available optical attenuators. At least one of the optical attenuators 120-1, 120-2, 120-3, . . . , and 120-N may be other types of optical attenuators such as variable optical attenuators.

The optical coupler 130 may combine the second optical signals PSA2-1, PSA2-2, PSA2-3, . . . , and PSA2-N together, thus generating a third optical signal PSA3. An intensity of the third optical signal PSA3 may be determined based on intensities of the second optical signals PSA2-1, PSA2-2, PSA2-3, . . . , and PSA2-N and an insertion loss of the optical coupler 130. In some embodiments, the optical coupler 130 algebraically combines the intensities of the second optical signals PSA2-1, PSA2-2, PSA2-3, . . . , and PSA2-N. As described above, the second optical signal PSA2-1, PSA2-2, PSA2-3, . . . , or PSA2-N may have various intensities according to the corresponding input signals signal DB-1, DB-2, DB-3, . . . , or DB-N and according to the corresponding attenuation of the optical attenuator 120-1, 120-2, 120-3, . . . , or 120-N. Therefore, the third optical signal PSA3 may have various discrete intensities by algebraically combining the various discrete intensities of the second optical signals PSA2-1, PSA2-2, PSA2-3, . . . , and PSA2-N. By way of example, when a 4-bit digital signal including the input signals DB-1, DB-2, DB-3 and DB-4 is provided to the DAC 100, the third optical signal PSA3 may have $2^4$ discrete intensities that are different from each other. As discussed above, in the case where the 4-bit digital signal has a bit pattern "1001", the second optical signal PSA2-1 having an intensity of $0.1 \times I_0$, and the second optical signal PSA2-4 having an intensity of about $0.794 \times I_0$ may be produced through the optical attenuators 120-1 and 120-4 having the optical attenuations of 10 dB and 1 dB, respectively. The optical coupler 130 algebraically combines the intensities of the second optical signals PSA2-1 and PSA2-4, and generates the third optical signal PSA3 having the intensity of about $0.894 \times I_0$. Likewise, the optical coupler 130 generates the third optical signal PSA3 having intensities of $2^4$ discrete intensities in response to the $2^4$ bit patterns of the input signals DB-1, DB-2, DB-3 and DB-4 and in response to the corresponding optical attenuations 10 dB, 7 dB, 4 dB and 1 dB.

The insertion loss denotes the power lost while the second optical signals PSA2-1, PSA2-2, PSA2-3, . . . , and PSA2-N pass through the optical coupler 130. The insertion loss may have different values according to the type of the optical coupler 130. The optical coupler 130 may be, for example, a known, commercially available optical coupler such as an N×1 coupler. The N×1 coupler receives as input N optical signals and outputs one optical signal.

The photodetector 140 converts the third optical signal PSA3 into an electrical analog signal ASA. An intensity of the electrical analog signal ASA may vary in proportion to the intensity of the third optical signal PSA3. By way of example, the photodetector 140 may convert the third optical signal PSA3 having $2^N$ different intensities into the electrical analog signal ASA having $2^N$ different intensities. The electrical analog signal ASA may be a type of, for example, current or voltage. The photodetector 140 may be, for example, a known, commercially available photodetector such as a photodiode. The photodiode may be, for example, a positive-intrinsic-negative (PIN) photodiode.

In some embodiments, the amplifier 150 may couple the optical coupler 130 with the photodetector 140, and amplify the intensity of the third optical signal PSA3. The third optical signal PSA3 having the amplified intensity may be provided to the photodetector 140. A gain of the amplifier 150 may denote the ratio of output intensity to input intensity. The gain of the amplifier 150 may be determined based on the intensity of the third optical signal PSA3 and a threshold value of the photodetector 140. The threshold value of the photodetector 140 indicates a minimum intensity of the amplified third optical signal PSA3 in order to drive the photodetector 140 to generate the electrical analog signal ASA. The amplifier 150 may amplify the intensity of the third optical signal PSA3 before the third optical signal PSA3 is received at the photodetector 140 in order to maintain the amplified intensity of the third optical signal PSA3 over the threshold value of the photodetector 140. In this case, the minimum gain of the amplifier 150 may be expressed by the ratio of the threshold value of the photodetector 140 to the corresponding intensity of the third optical signal PSA3. In other embodiments, when the intensity of the third optical signal PSA3 outputted from the optical coupler 130 is maintained to be greater than or equal to the threshold value of the photodetector 140, the DAC 100 may not include the amplifier 150 before the photodetector 140.

In some embodiments, the amplifier 150 may be disposed behind (that is, after) the photodetector 140 to amplify the electrical analog signal ASA output by the photodetector 140 over a predetermined value. The predetermined value may vary according to the type of electronic device employing the electrical analog signal ASA. In other embodiments, when the intensity of the electrical analog signal ASA is greater than or equal to the predetermined value of the electronic device receiving the electrical analog signal ASA, the DAC 100 may not include the amplifier 150 behind the photodetector 140.

As described above, the DAC 100 according to some embodiments may include the electro-optical converters 110-1, 110-2, 110-3, . . . , and 110-N and the optical attenuators 120-1, 120-2, 120-3, . . . , and 120-N. The electro-optical converters 110-1, 110-2, 110-3, . . . , and 110-N may generate the first optical signals PSA1-1, PSA1-2, PSA1-3, . . . , and PSA1-N in response to the input signal DB-1, DB-2, DB-3, . . . , and DB-N. The first optical signal PSA1-1, PSA1-2, PSA1-3, . . . , or PSA1-N may be generated by the laser diode 170-1, 170-2, 170-3, . . . , or 170-N driven by the driver 160-1, 160-2, 160-3, . . . , or 160-N. The laser diodes 170-1, 170-2, 170-3, . . . , and 170-N may be separate from each other, and thus the first optical signals PSA1-1, PSA1-2, PSA1-3, . . . , and PSA1-N can have a random phase difference from each other. The first optical signals PSA1-1, PSA1-2, PSA1-3, . . . , and PSA1-N having the random phase difference from each other can have incoherent characteristics. The DAC 100 using the first optical signals PSA1-1, PSA1-2, PSA1-3, . . . , and PSA1-N having the incoherent characteristics can have low interference characteristics.

Figure 2:
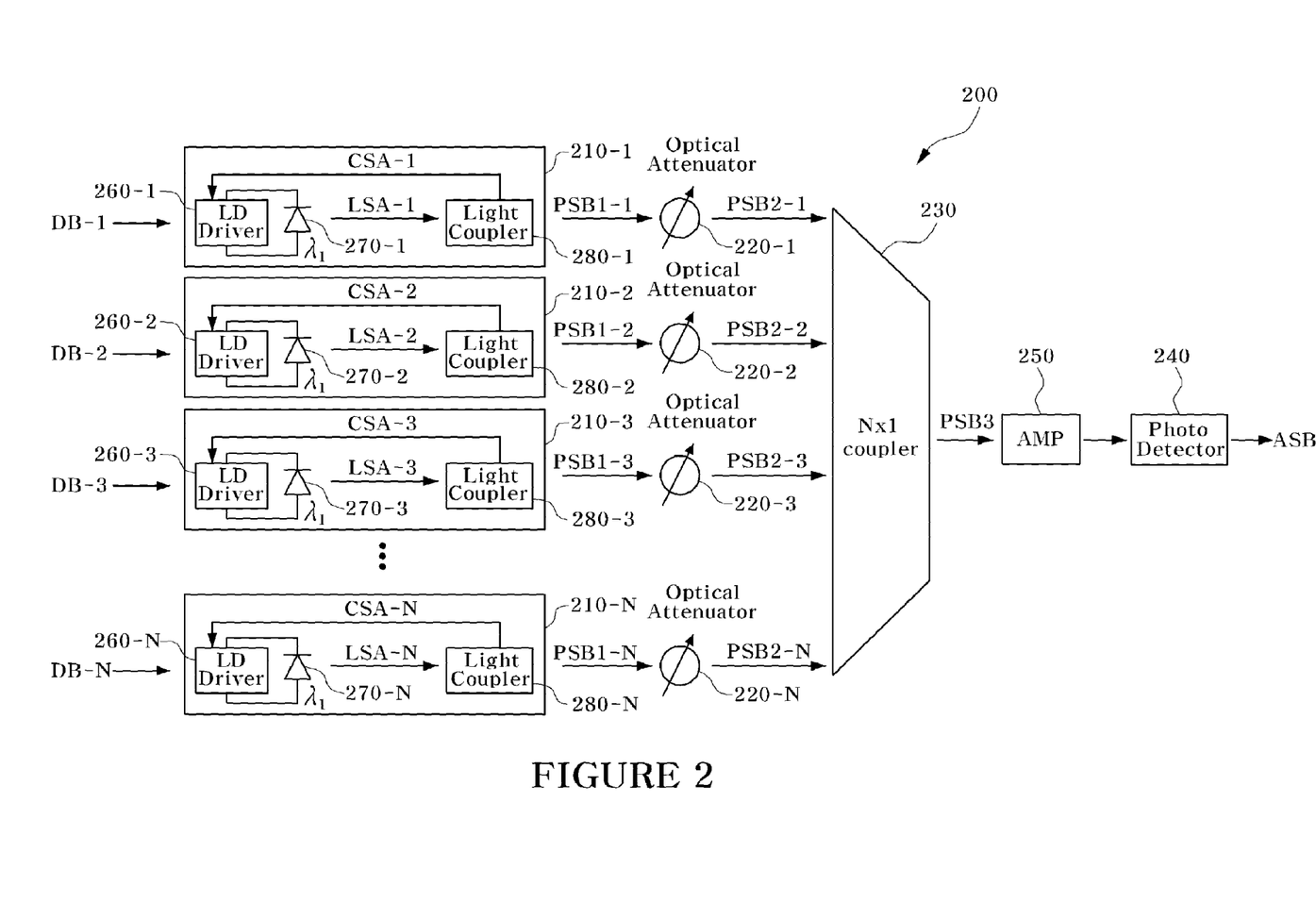
FIG. 2 shows a schematic of another illustrative embodiment of a DAC.

FIG. 2 shows a schematic of another illustrative embodiment of a DAC. As illustrated, a DAC 200 may include a multiple number of electro-optical converters 210-1, 210-2, 210-3, . . . , and 210-N that generate a multiple number of first optical signals, a multiple number of optical attenuators 220-1, 220-2, 220-3, . . . , and 220-N that attenuate intensities of the first optical signals to a multiple number of second optical signals, an optical coupler 230 that combines the second optical signals to generate a third optical signal, and a photodetector 240 that converts the third optical signal into an electrical analog signal. In some embodiments, the DAC 200 may optionally further include an amplifier 250 which couples the optical coupler 230 with the photodetector 240 to amplify the intensity of the third optical signal.

The electro-optical converter 210-1, 210-2, 210-3, . . . , or 210-N may include a driver 260-1, 260-2, 260-3, . . . , or 260-N, a laser diode 270-1, 270-2, 270-3, . . . , or 270-N, and a light coupler 280-1, 280-2, 280-3, . . . , or 280-N. The light coupler 280-1, 280-2, 280-3, . . . , or 280-N may divide a laser signal LSA-1, LSA-2, LSA-3, . . . , or LSA-N of the laser diode 270-1, 270-2, 270-3, . . . , or 270-N into a first optical signal PSB1-1, PSB1-2, PSB1-3, . . . , or PSB1-N and a control signal CSA-1, CSA-2, CSA-3, . . . , or CSA-N. A ratio of an intensity of the first optical signal PSB1-1, PSB1-2, PSB1-3, . . . , or PSB1-N to an intensity of the control signal CSA-1, CSA-2, CSA-3, or CSA-N may be predetermined and adjusted by the light coupler 280-1, 280-2, 280-3, . . . , or 280-N. The control signal CSA-1, CSA-2, CSA-3, . . . , or CSA-N may be applied to the driver 260-1, 260-2, 260-3, . . . , or 260-N. The driver 260-1, 260-2, 260-3, . . . , or 260-N may adjust power applied to the laser diode 270-1, 270-2, 270-3, . . . , or 270-N, based on the control signal CSA-1, CSA-2, CSA-3, . . . , or CSA-N. In some embodiments, the driver 260-1, 260-2, 260-3, . . . , or 260-N may have a photodetector (not shown) and a comparator (not shown). The photodetector may receive the control signal CSA-1, CSA-2, CSA-3, . . . , or CSA-N and convert the control signal CSA-1, CSA-2, CSA-3, . . . , or CSA-N into an electrical signal. The comparator may compare the electrical signal with a predetermined reference value. When an intensity of the electrical signal is less than the predetermined reference value, the comparator may increase the power applied to the laser diode 270-1, 270-2, 270-3, . . . , or 270-N. As the power increases, an intensity of the laser signal LSA-1, LSA-2, LSA-3, . . . , or LSA-N and an intensity of the first optical signal PSB1-1, PSB1-2, PSB1-3, . . . , or PSB1-N may also increase. When the intensity of the electrical signal is greater than the predetermined reference value, the comparator may reduce the power applied to the laser diode 270-1, 270-2, 270-3, . . . , or 270-N. When the power decreases, an intensity of the laser signal LSA-1, LSA-2, LSA-3, . . . , or LSA-N and an intensity of the first optical signal PSB1-1, PSB1-2, PSB1-3, . . . , or PSB1-N may also decrease. In some embodiments, the comparator adjusts the power applied to the laser diode 270-1, 270-2, 270-3, . . . , or 270-N such that the first optical signal PSB1-1, PSB1-2, PSB1-3, . . . , or PSB1-N may have substantially the same intensity as the predetermined intensity. Here, the first optical signal PSB1-1, PSB1-2, PSB1-3, . . . , or PSB1-N being substantially the same as the predetermined intensity indicates that the intensity of the first optical signal PSB1-1, PSB1-2, PSB1-3, . . . , or PSB1-N is exactly the same as the predetermined intensity or within a predetermined permissible error range. By way of example, a permissible error of an intensity of a first optical signal corresponding to an MSB may be less than a permissible error of an intensity of a first optical signal corresponding to an LSB. The light coupler 280-1, 280-2, 280-3, . . . , or 280-N may be, for example, a 1×2 optical splitter. Using the 1×2 optical splitter, one optical signal as input can be divided into two optical signals as output.

The structure and operation of the optical attenuators 220-1, 220-2, 220-3, . . . , and 220-N outputting second optical signals PSB2-1, PSB2-2, PSB2-3, . . . , and PSB2-N, the optical coupler 230 outputting a third optical signal PSB3, the photodetector 240 outputting an electrical analog signal ASB, the amplifier 250 amplifying the third optical signal PSB3, the drivers 260-1, 260-2, 260-3, . . . , and 260-N, and the laser diodes 270-1, 270-2, 270-3, . . . , and 270-N are substantially the same as those of the optical attenuators 120-1, 120-2, 120-3, . . . , and 120-N, the optical coupler 130, the photodetector 140, the amplifier 150, the drivers 160-1, 160-2, 160-3, . . . , and 160-N, and the laser diodes 170-1, 170-2, 170-3, . . . , and 170-N described above with reference to FIG. 1, and thus the descriptions of the structure and operation will not be reiterated.

As described above, the DAC 200 according to some embodiments includes the electro-optical converter 210-1, 210-2, 210-3, . . . , or 210-N having the light coupler 280-1, 280-2, 280-3, . . . , or 280-N. The light coupler 280-1, 280-2, 280-3, . . . , or 280-N may adjust the intensity of the first optical signal PSB1-1, PSB1-2, PSB1-3, . . . , or PSB1-N to a predetermined value using the control signal CSA-1, CSA-2, CSA-3, . . . , or CSA-N. Consequently, even if the laser signals LSA-1, LSA-2, LSA-3, . . . , and LSA-N have intensities that are different from each other, the electro-optical converters 210-1, 210-2, 210-3, . . . , and 210-N of the DAC 200 can provide the first optical signals PSB1-1, PSB1-2, PSB1-3, . . . , and PSB1-N having substantially the same intensity as each other.

Figure 3:
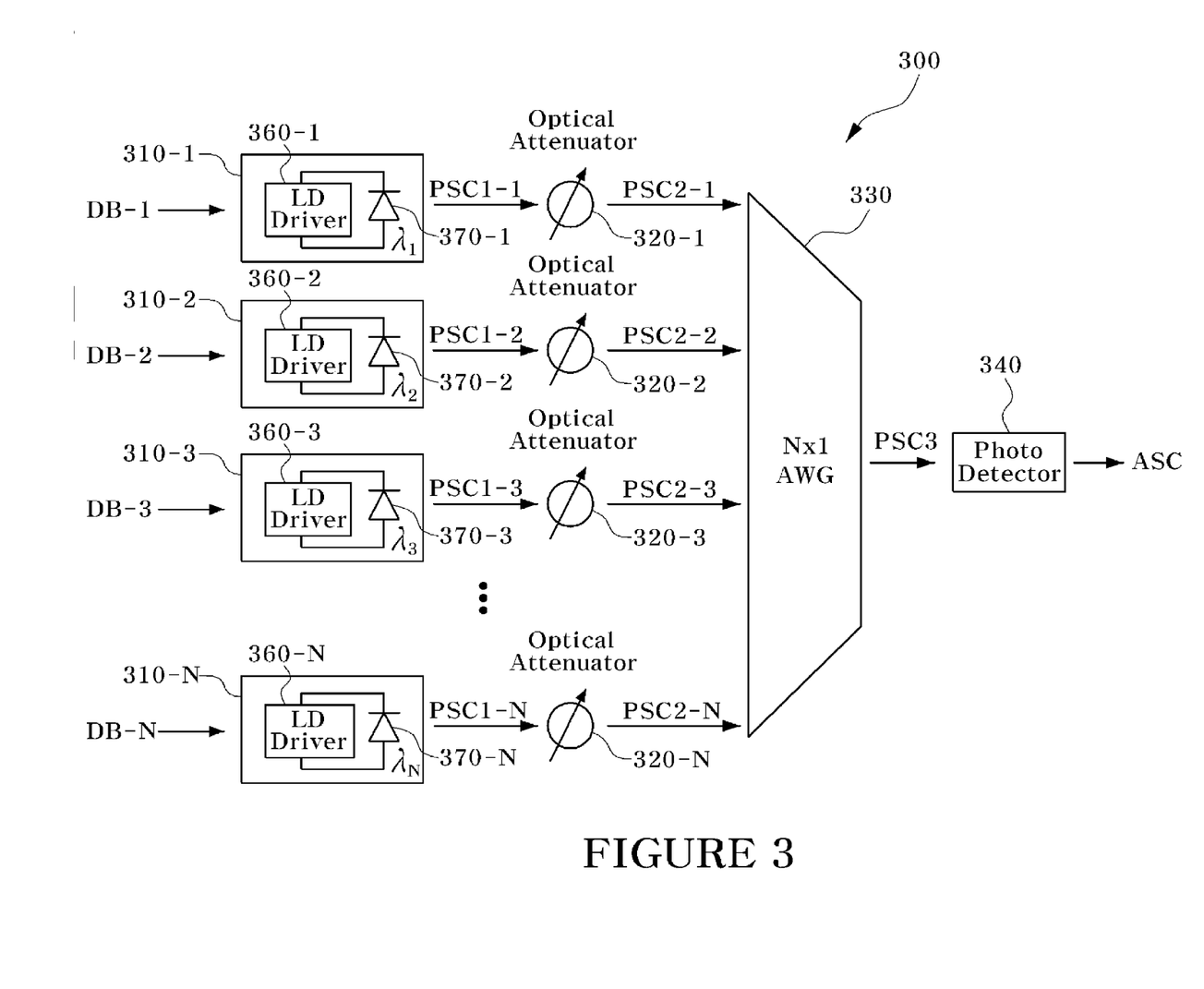
FIG. 3 shows a schematic of still another illustrative embodiment of a DAC.

FIG. 3 shows a schematic of still another illustrative embodiment of a DAC. As illustrated, a DAC 300 may include a multiple number of electro-optical converters 310-1, 310-2, 310-3, . . . , and 310-N that generate a multiple number of first optical signals, a multiple number of optical attenuators 320-1, 320-2, 320-3, . . . , and 320-N that attenuate intensities of the first optical signals to generate a multiple number of second optical signals, an optical coupler 330 that combines the second optical signals to generate a third optical signal, and a photodetector 340 that converts the third optical signal into an electrical analog signal ASC. The structure of the DAC 300 is substantially the same as the structure of the DAC 100 except that an N×1 arrayed waveguide grating (AWG) is used as the optical coupler 330.

The electro-optical converters 310-1, 310-2, 310-3, ..., and 310-N may generate a multiple number of first optical signals PSC1-1, PSC1-2, PSC1-3, ..., and PSC1-N having various wavelengths with each other. The electro-optical converter 310-1, 310-2, 310-3, ..., or 310-N may include a driver 360-1, 360-2, 360-3, ..., or 360-N and a laser diode 370-1, 370-2, 370-3, ..., or 370-N. The structure and operation of the electro-optical converters 310-1, 310-2, 310-3, ..., and 310-N are substantially the same as the structure and operation of the electro-optical converter 110-1, 110-2, 110-3, ..., and 110-N described above with reference to FIG. 1, and thus the descriptions of the structure and operation will not be reiterated.

The optical coupler 330 may combine a multiple number of second optical signals PSC2-1, PSC2-2, PSC2-3, ..., and PSC2-N having various wavelengths and generate a third optical signal PSC3. As shown in the drawing, the optical coupler 330 is an N×1 AWG. The N×1 AWG receives as input N optical signals having various wavelengths and outputs one optical signal. An insertion loss of the N×1 AWG may be affected not by N, which is the number of the received optical signals, but by an insertion loss of the N×1 AWG. The operation of the optical coupler 330 is substantially the same as the operation of the optical coupler 130 described above with reference to FIG. 1, and thus the description of operation will not be reiterated.

As described above, the DAC 300 according to some embodiments includes an N×1 AWG as the optical coupler 330. The N×1 AWG may receive as input second optical signals PSC2-1, PSC2-2, PSC2-3, ..., and PSC2-N having various wavelengths and output the third optical signal PSC3. An insertion loss of the N×1 AWG is not affected by N, which is the number of the received second optical signals PSC2-1, PSC2-2, PSC2-3, ..., and PSC2-N originated from the input signals DB-1, DB-2, DB-3, ..., and DB-N. Consequently, the N×1 AWG of the DAC 300 can have a low insertion loss so that the DAC 300 can obtain the third optical signal PSC3 having the increased intensity.

Figure 4:
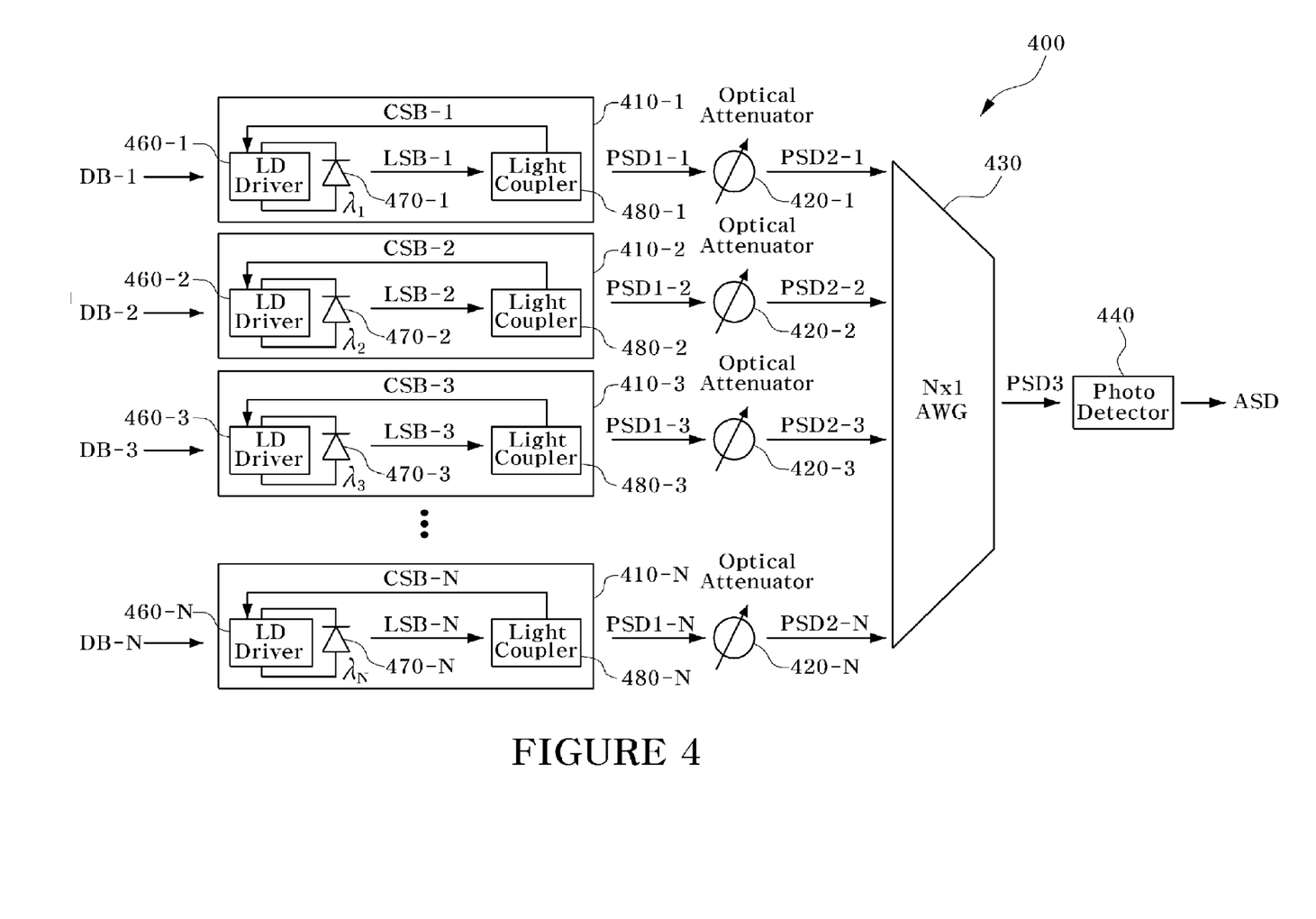
FIG. 4 shows a schematic of a further illustrative embodiment of a DAC.

FIG. 4 shows a schematic of a further illustrative embodiment of a DAC. As illustrated, a DAC 400 may include a multiple number of electro-optical converters 410-1, 410-2, 410-3, ..., and 410-N that generate a multiple number of first optical signals, a multiple number of optical attenuators 420-1, 420-2, 420-3, ..., and 420-N that attenuate intensities of the first optical signals to generate a multiple number of second optical signals, an optical coupler 430 that combines the second optical signals to generate a third optical signal, and a photodetector 440 that converts the third optical signal into an electrical analog signal ASD. The electro-optical converter 410-1, 410-2, 410-3, ..., or 410-N may include a driver 460-1, 460-2, 460-3, ..., or 460-N, a laser diode 470-1, 470-2, 470-3, ..., or 470-N, and a light coupler 480-1, 480-2, 480-3, ..., or 480-N.

The structure and operation of the DAC 400 are substantially the same as the structure and operation of the DAC 300 described above with reference to FIG. 3, except that the electro-optical converter 410-1, 410-2, 410-3, ..., or 410-N further includes the light coupler 480-1, 480-2, 480-3, ..., or 480-N. The light coupler 480-1, 480-2, 480-3, ..., or 480-N may divide a laser signal LSB-1, LSB-2, LSB-3, ..., or LSB-N of the laser diode 470-1, 470-2, 470-3, ..., or 470-N into a first optical signal PSD1-1, PSD1-2, PSD1-3, ..., or PSD1-N and a control signal CSB-1, CSB-2, CSB-3, ..., or CSB-N. The operation of the light coupler 480-1, 480-2, 480-3, ..., or 480-N is substantially the same as the operation of the light coupler 280-1, 280-2, 280-3, ..., or 280-N described above with reference to FIG. 2.

As described above, the DAC 400 according to some embodiments may adjust an intensity of the control signal CSB-1, CSB-2, CSB-3, ..., or CSB-N and an intensity of the first optical signal PSD1-1, PSD1-2, PSD1-3, ..., or PSD1-N using the light coupler 480-1, 480-2, 480-3, ..., or 480-N. Consequently, even if the laser signals LSB-1, LSB-2, LSB-3, ..., and LSB-N have intensities that are different from each other, the electro-optical converters 410-1, 410-2, 410-3, ..., and 410-N of the DAC 400 can provide the first optical signals PSD1-1, PSD1-2, PSD1-3, ..., and PSD1-N having substantially the same intensity as each other. Also, an N×1 AWG is used as the optical coupler 430 to combine a multiple number of second optical signals PSD2-1, PSD2-2, PSD2-3, ..., and PSD2-N having various wavelengths with each other and generate a third optical signal PSD3. An insertion loss of the N×1 AWG is not affected by N, which is the number of the received second optical signals PSD2-1, PSD2-2, PSD2-3, ..., and PSD2-N originated from the input signals DB-1, DB-2, DB-3, ..., and DB-N. Consequently, the N×1 AWG of the DAC 400 can have a low insertion loss so that the DAC 400 can obtain the third optical signal PSD 3 having the increased intensity.

Figure 5:
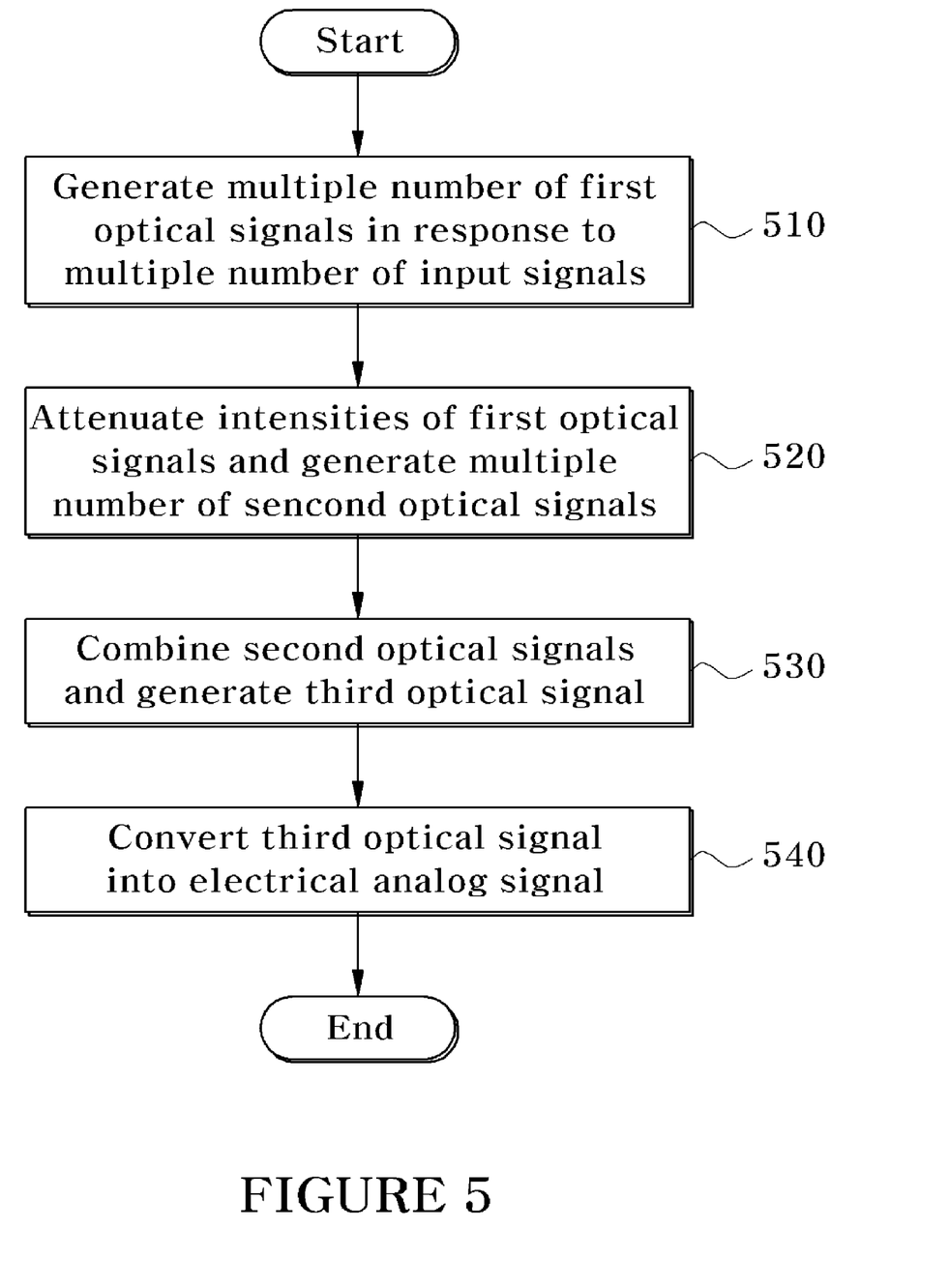
FIG. 5 is a flowchart of an illustrative embodiment of a method for converting a digital signal into an analog signal.

FIG. 5 is a flowchart of an illustrative embodiment of a method for converting a digital signal into an analog signal. Referring to FIG. 5, in block 510, multiple electro-optical converters generate a multiple number of first optical signals in response to a multiple number of input signals. The first optical signals may have substantially the same intensity as each other. The electro-optical converters may generate the first optical signals in response to the corresponding input signals. In block 520, multiple optical attenuators attenuate the intensities of the first optical signals and generate a multiple number of second optical signals. The optical attenuators may differentially attenuate the intensities of the first optical signals according to weights of the corresponding input signals and generate the second optical signals. The optical attenuators may respectively attenuate the intensities of the first optical signals by M−3(N−1) dB, M−3(N−2) dB, ..., and M dB according to the weights and generate the second optical signals. In block 530, an optical coupler combines the second optical signals and generates a third optical signal. For example, the optical coupler may be an N×1 coupler or an N×1 AWG. In block 540, a photodetector converts the third optical signal into an electrical analog signal. For example, the photodetector may be a photodiode.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A digital-to-analog converter (DAC) comprising:
    a plurality of electro-optical converters each configured to selectively generate one of a plurality of first optical signals in response to a corresponding one of a plurality of digital input signals collectively representing a selected one of a plurality of bit patterns associated with the DAC;
    a plurality of optical attenuators, each configured to attenuate an intensity of a corresponding one of the plurality of first optical signals to generate a plurality of second optical signals, wherein each of the plurality of optical attenuators is configured to have a different optical attenuation such that the corresponding ones of the plurality of second optical signals have different intensities;
    an optical coupler configured to combine the plurality of second optical signals and to generate a third optical signal; and
    a photodetector configured to convert the third optical signal into an electrical analog signal having a signal level corresponding to a digital-to-analog conversion of the selected one of the plurality of bit patterns.

2. The DAC of claim 1, wherein the electro-optical converters comprise:
    a plurality of laser diodes; and
    a plurality of drivers configured to drive the plurality of laser diodes in response to the digital input signals.

3. The DAC of claim 1, wherein the electro-optical converters are configured to generate the first optical signals having substantially the same intensity as each other.

4. The DAC of claim 1, wherein the electro-optical converters comprise:
    a plurality of laser diodes;
    a plurality of drivers configured to drive the laser diodes in response to the input signals; and
    a plurality of light couplers configured to divide a plurality of laser signals generated by the laser diodes into the first optical signals and a plurality of control signals,
    wherein operations of the drivers are adjusted by the control signals so that the electro-optical converters generate the first optical signals having substantially the same intensity as each other.

5. The DAC of claim 1, wherein the optical attenuators are configured to differentially attenuate the intensities of the first optical signals according to weights of the corresponding digital input signals.

6. The DAC of claim 1, wherein the optical coupler is an N×1 optical coupler, where N (N is an integer greater than or equal to 2) denotes a number of bits in each of the bit patterns.

7. The DAC of claim 6, wherein the optical attenuators respectively have optical attenuations of M−3(N−1) dB, M−3(N−2) dB, . . . , and M dB, where M is a number greater than 3(N−1).

8. The DAC of claim 1, wherein the optical coupler is an N×1 arrayed waveguide grating (AWG), where N (N is an integer greater than or equal to 2) denotes a number of bits in each of the bit patterns.

9. The DAC of claim 8, wherein the optical attenuators respectively have optical attenuations of M−3(N−1) dB, M−3(N−2) dB, . . . , and M dB, where M is a number greater than 3(N−1).

10. The DAC of claim 9, wherein the electro-optical converters are configured to generate the first optical signals, each having a different of various wavelength.

11. The DAC of claim 1, further comprising an amplifier coupling the optical coupler with the photodetector, the amplifier configured to amplify an intensity of the third optical signal, and to apply the third optical signal having the amplified intensity to the photodetector.

12. The DAC of claim 1, wherein the photodetector is a photodiode.

13. A method for converting a digital signal into an analog signal, comprising:
    generating a plurality of first optical signals in response to a plurality of digital input signals, the plurality of digital input signals collectively representing a selected one of a plurality of bit patterns associated with a digital-to-analog converter (DAC);
    attenuating intensities of the first optical signals using a plurality of optical attenuators, each having a different optical attenuation, to generate a plurality of second optical signals having different intensities from each other;
    combining the second optical signals to generate a third optical signal; and
    converting the third optical signal into an electrical analog signal having a signal level corresponding to a digital-to-analog conversion of the selected one of the plurality of bit patterns.

14. The method of claim 13, wherein the first optical signals have substantially the same intensity as each other.

15. The method of claim 13, wherein attenuating intensities of the first optical signals comprises differentially attenuating the intensities of the first optical signals according to weights of the corresponding digital input signals.

16. The method of claim 15, wherein attenuating intensities of the first optical signals to generate the plurality of second optical signals comprises respectively attenuating the intensities of the first optical signals by M−3(N−1) dB, M−3(N−2) dB, . . . , and M dB according to the weights, where N (N is an integer greater than or equal to 2) denotes a number of bits in each of the bit patterns, and M is a number greater than 3(N−1).

17. The method of claim 13, wherein combining the second optical signals to generate the third optical signal comprises:
    inputting the second optical signals into an N×1 coupler; and
    generating the third optical signal by the N×1 coupler, wherein N (N is an integer greater than or equal to 2) denotes a number of the second optical signals.

18. The method of claim 13, wherein combining the second optical signals to generate the third optical signal comprises:

inputting the second optical signals into an N×1 AWG; and generating the third optical signal using the N×1 AWG, wherein N (N is an integer greater than or equal to 2) denotes a number of the second optical signals.

19. A digital-to-analog converter (DAC) comprising:

a means for generating a plurality of first optical signals in response to a plurality of digital input signals, the plurality of digital input signals collectively representing a selected one of a plurality of bit patterns associated with the DAC;

a means for attenuating intensities of the first optical signals to generate a plurality of second optical signals having different intensities from each other;

a means for combining the second optical signals to generate a third optical signal; and a means for converting the third optical signal into an electrical analog signal having a signal level corresponding to a digital-to-analog conversion of the selected one of the plurality of bit patterns.

20. The DAC of claim 19, wherein the means for attenuating intensities of the first optical signals comprises a means for differentially attenuating the intensities of the first optical signals according to weights of the corresponding digital input signals.

* * * * *

UNITED STATES PATENT AND TRADEMARK OFFICE
CERTIFICATE OF CORRECTION

PATENT NO. : 7,889,107 B2
APPLICATION NO. : 12/482997
DATED : February 15, 2011
INVENTOR(S) : Lee It is certified that error appears in the above-identified patent and that said Letters Patent is hereby corrected as shown below:

In Fig. 5, Sheet 5 of 5, for Tag "520", in Line 3, delete "sencond" and insert -- second --, therefor.

In Column 5, Line 34, delete "PAS1-3" and insert -- PSA1-3 --, therefor.

In Column 12, Line 22, in Claim 10, delete "different of various" and insert -- different --, therefor.

Signed and Sealed this
First Day of May, 2012

David J. Kappos
*Director of the United States Patent and Trademark Office*